(12) United States Patent
Spanner et al.

(10) Patent No.: US 7,392,164 B2
(45) Date of Patent: Jun. 24, 2008

(54) COMPUTER PROGRAM PRODUCT AND A CARRIER FOR SUPPORTING A USER DESIGNING A HYDRAULIC CYLINDER BY INDICATING PREFERRED COMPONENTS OF SEALS, RINGS AND BEARINGS

(75) Inventors: Roland Spanner, Stockholm (SE); Jürgen Scholer, Beckengen (DE); Tage Staflund, Rydebäck (SE); Niclas Hansson, Göteborg (SE)

(73) Assignee: Aktiebolaget SKF, Gothenburg (SE)

( * ) Notice: Subject to any disclaimer, the term of this patent is extended or adjusted under 35 U.S.C. 154(b) by 762 days.

(21) Appl. No.: 10/120,608

(22) Filed: Apr. 12, 2002

(65) Prior Publication Data

US 2002/0186227 A1    Dec. 12, 2002

(30) Foreign Application Priority Data

Apr. 20, 2001   (SE)   .................. 0101409-1

(51) Int. Cl.
*G06G 7/48* (2006.01)

(52) U.S. Cl. .......................................... 703/7

(58) Field of Classification Search .................. 703/7
See application file for complete search history.

(56) References Cited

U.S. PATENT DOCUMENTS 6,173,210 B1 *   1/2001   Bjornson et al. ............. 700/99

OTHER PUBLICATIONS

Parametric Computer Aided Hydraulic Cylinder Design, Johannesson, H., Advances in Design Automation, 1990, 23(1), pp. 297-304.*

* cited by examiner

*Primary Examiner*—Paul Rodriguez
*Assistant Examiner*—Juan Carlos Ochoa
(74) *Attorney, Agent, or Firm*—Buchanan Ingersoll & Rooney PC

(57) ABSTRACT

Computer program product for supporting a user in designing a sealing system of a hydraulic cylinder by indicating at least one sealing system component related to one of: seals, guide rings and rod end bearings for application in the hydraulic cylinder based on the working conditions of the hydraulic cylinder. The computer program product is arranged to obtain sealing system component information items from a database, including: a sealing system component text information item; a duty level information item; a sealing system component graphic information item; and a rod end information item. The rod end information item includes sealing intensity as a function of environment temperature.

18 Claims, 2 Drawing Sheets

COMPUTER PROGRAM PRODUCT AND A CARRIER FOR SUPPORTING A USER DESIGNING A HYDRAULIC CYLINDER BY INDICATING PREFERRED COMPONENTS OF SEALS, RINGS AND BEARINGS

This application claims priority under 35 U.S.C., §§ 119 and/or 365 to patent application Ser. No. 0101409-1 filed in Sweden on Apr. 20, 2001.

TECHNICAL FIELD

The present invention relates to a computer program product, and a carrier, for supporting a user designing a hydraulic cylinder by indicating at least one component related to one of seals, rings and bearings which is preferred for application in the hydraulic cylinder based on the working conditions of the hydraulic cylinder.

TECHNICAL BACKGROUND

The progress in the fields of computers and communications have reached a point where they can offer an increased competitive advantage for companies also within more mature technical fields, such as bearings and seals.

The knowledge contents of products and procedures related to these products have increased during the last decade. Even though the basic principles of today's bearings and seals in some cases are almost 100 years old, the knowledge involved with today's bearings, rings and seals has increased in importance.

As a result of the growing knowledge in the field of bearings and seals during recent years, products, their use and application have become more differentiated and complex. Also the knowledge of designing technical solutions incorporating bearings and/or seals in other products has become increasingly important during recent years. An example of knowledge related to a technical solution is knowing what specific sealing system to use in a specific application and what bearings not to use. Using non-optimum sealing systems increases the likelihood of malfunction or at least a shortened machine life.

Superior manufacturers of bearings and seals have noticed the quality of offering supporting knowledge to customers, potential customers, and technical staff. The increased knowledge contents in this field have lead to an increased need of conveying information that a customer can use as support. For instance the risk of a customer selecting a non-optimum product component or application of a product has increased due to the increased knowledge contents that has to be associated with the modern products today in the bearings and seals industry. Today additional support is in some cases necessary. Otherwise the customer is at risk of a lower performance of an application of a sealing system.

More specifically, off road machinery in mining and construction requires today 10,000 hours, or more, of maintenance-free operating time for the hydraulic cylinders that are used. Offering this amount of maintenance-free operating time is difficult to reach for suppliers of hydraulic cylinders and their components included. Therefore, the hydraulic cylinders are one of the most critical parts of such mobile equipment and the seals and the bearings are the weakest components in a hydraulic cylinder.

About 75% of all complaints concern leakage, mainly caused by damaged seals and sometimes also by bad welding. The lifetime for a bearing is usually strongly decreased by the encroachment of contaminants into the bearing with damage and high down time costs as a result.

Recent knowledge indicates that it is not the choice of the design of the individual seal, wiper, guide ring or bearing which provides the maintenance-free applications, maintenance-free operating times exceeding 10,000 hours, but it is the distinct balance in function between rod/piston sealing and guiding elements, as well as the right choice of rod end/bearings that increase the number of maintenance-free hours. This implies a holistic view of the design process of the sealing system of a hydraulic system instead of an analytical view construing the design process as a number, or sequence, of sub problems.

Thus, today when a sealing system of hydraulic cylinders is designed, a holistic view is normally not used. This may result in poor choices by the designer of the design of the combination of seals, wiper, guide rings and bearings if the distinct balance in function between rod/piston sealing and guiding elements, as well as the right choice of rod end/bearings, will not be achieved.

An indistinct balance may lead to a number of disadvantages of the hydraulic cylinder:
1) Limited maintenance-free operating lifetime of the hydraulic cylinder.
2) Decreased security of the sealing system of the hydraulic cylinder, since a poorly designed sealing system of a hydraulic system may lead to a collapse of the hydraulic cylinder.
3) Limited duty ability of the hydraulic cylinder.

A drawback of the design process today is that the information that is necessary can primarily be found only in printed material, such as manuals and product catalogues. This may make searching for information of for instance a specific seal, tedious. There is also an uncertainty aspect since there is a risk of mistakes when looking in printed material and transferring the information into the design. This may lead to wrong data being included in the design. For instance there is a risk that a seal which is not suited for a specific kind of duty will be wrongly included in the design by the designer.

Another drawback of the design process of sealing systems involves the limited possibilities of grasping the big picture of the design process. The big picture is considered important especially in the early phase of the design process.

Yet another drawback of the design process involves the limited possibilities of interacting with the production/mounting process. Today, it is not always easy for production/mounting personnel to obtain clear instructions from drawings provided by the designer.

SUMMARY OF THE INVENTION

A chief purpose of the present invention is to alleviate the drawbacks presented above.

Another purpose of the present invention is to speed up the process of the designing of the sealing system of a hydraulic cylinder.

These purposes are achieved by a first aspect of the present invention, which involves a computer program product for supporting a user designing a sealing system of a hydraulic cylinder by indicating at least one sealing system component related to one of: seals, guide rings and rod end bearings for application in the hydraulic cylinder based on the working conditions of the hydraulic cylinder.

The computer program product is arranged to obtain at least one sealing system component information item comprising information concerning a sealing system component related to one of: seals, guide rings and rod end bearings from at least one database. The at least one sealing system component information item is arranged to include:

1) a sealing system component text information item;
2) a duty level information item;
3) a sealing system component graphic information item;
4) a rod ends information item.

The computer program product is loadable into the internal memory of a computer and comprises computer program code portions for performing the following steps when run on a computer which includes input and output means:

a) Presenting an image of a hydraulic cylinder using the output means. This introduces the holistic view that has proven to be successful when it comes to designing sealing systems of hydraulic cylinders that offer 10,000 hours, or more, maintenance-free operating time.

b) Receiving design criteria in the form of duty level information and rod ends information of the hydraulic cylinder to be designed by the user using the input means to select one of a number of predetermined alternatives of duty level information and rod ends information presented using the output means. This information can be seen as the input parameters that will decide which sealing system components will be preferred.

c) Receiving an instruction from the user, using the input means, to present a selection of sealing system component information items using the output means, the selection indicating at least one sealing system component related to one of: seals, guide rings and rod end bearings for application in the hydraulic cylinder. The selection is assembled by searching the sealing system component information units in the at least one database, that comprises data of the sealing system component information items, in order to find sealing system component information items that fulfil the design criteria.

d) Receiving the user's sealing system component information item choice among the selection. This is an advantage since it reduces the risk of the designer, or the user of the program, to use wrong sealing system components. Thus the risk of decreased security and limited operating time is automatically reduced, since the designer cannot choose, for instance, a seal that will stop sealing due to a duty exceeding the duty limit of the seal.

e) Pasting the sealing system component graphic information item of the chosen sealing system component information item into the image at an appropriate place. This place is likely to be in its proper place in the image of the hydraulic cylinder. This offers the advantage of grasping the big picture that has proven necessary when designing a high quality sealing system.

f) Repeating steps b), c), d) and e) at the user's request. This offers the advantage of altering sealing system components in the design. This is useful since the designer may want to make changes in the design in the computer aided design computer program product.

According to a second aspect of the present invention a carrier, such as a CD-ROM, comprising the above-described computer program product. This aspect offers the advantage of distributing the program easily and swiftly.

In a preferred embodiment, the computer program product is arranged as a program component in a conventional computer aided design computer program product. This offers the advantage that the user can obtain instantaneous support when designing a sealing system of a hydraulic cylinder by indicating at least one sealing system component information item related to one of: seals, guide rings and rod end bearings for application in the hydraulic cylinder based on the working conditions of the hydraulic cylinder.

In another preferred embodiment, the computer program product is arranged to export one or more sealing system component information items, or a part thereof, into the conventional computer aided design computer program product. In another preferred embodiment, the sealing system component text information item includes at least one of: product name, groove design, dimensions, tolerances, and surface roughness of a sealing system component. In another preferred embodiment, the computer program product is arranged to accomplish the export of a sealing system component graphic information item of a sealing system component information item into a computer aided design drawing.

These three preferred embodiments offer the advantage that the user can easily and swiftly transfer information, such as a drawing, from the present invention to the conventional computer aided design computer program product that is helpful in the process of production and mounting of the hydraulic cylinder.

In another preferred embodiment of the computer program product the at least one database is comprised within the computer program product. This leads to the advantage that it can be easier to handle, for instance in terms of its distribution.

In another preferred embodiment of the computer program product, the at least one database is not comprised within the computer program product but it is arranged to be accessible via a communication network, such as the internet. This leads to the advantage that the database is not static, as in the preferred embodiment above, but it can be changed after that the computer program product has been distributed. It is especially preferred if the database is on a server, which facilitates easy and swift updating of the information in the database. This leads to the advantage that user of the computer program product can obtain support which is based on an on-line basis.

In another preferred embodiment of the computer program product, the sealing system component text information item includes at least one of: rod end bearing type, rod end bearing seal type, wiper seal type, guide ring type, rod seal type, and piston seal type. The advantage of these types is that they cover key components of the sealing system of a hydraulic cylinder, i.e., they can be seen as building blocks.

In another preferred embodiment of the computer program product, the duty level information item is arranged to be one of: 'Light', 'Medium', and 'Heavy'. These levels offer the advantage that they provide a three level discrete spectrum indicating what duty level a single sealing system component can accept.

In another preferred embodiment of the computer program product, the duty level information item is arranged to be a result from calculation of the duty levels information items combined with inputted data related to at least one of: pressure, velocity, and temperature. In case a user inputs the pressure, P, then the computer program product according to this preferred embodiment performs the calculation to compare the pressure P to a set of predetermined values indicating duty levels, for instance $P_{Light}$, $P_{medium}$, and $P_{Heavy}$. If $P<P_{Light}$ then the duty level will be set to 'Light'. In case a user desires to input a set of data of pressure, velocity and temperature, this preferred embodiment is arranged to accomplish a result indicating what duty level that is relevant.

In another preferred embodiment of the computer program product, the component graphic information item is one of: a detailed drawing showing details of a component and a schematic drawing depicting a component. The detailed drawing is intended to be inserted in the image. The schematic drawing is intended to be inserted in the selection of sealing system component information items that fulfil the design criteria. Thus the selection is intended to be shown graphically. In another preferred embodiment the selection is presented using product names instead of their corresponding graphic representation.

In another preferred embodiment of the computer program product, the rod end information item comprises at least one of: operating condition, axial misalignment and assembly variant. This offers the advantage that the working environment of the rod ends is introduced as input parameters.

In another preferred embodiment of the computer program product, the input means is constituted by either of a keyboard and a mouse.

In another preferred embodiment of the computer program product, the output means comprises a computer screen.

In another preferred embodiment of the computer program product, in case the user changes at least one of the duty level information and rod end information during the design process, the computer program product is arranged:

1) To check whether the change leads to a mismatch in the hydraulic cylinder design by searching in the at least one database for mismatch in relation to the present design and the change, and
2) To indicate for the user if a mismatch has occurred.

This offers the advantage that the computer program product automatically checks whether the change ordered by the user introduces security hazards. For instance, it may occur that the user has started the design of a sealing system of a hydraulic cylinder intended for light duty and has pasted a number of seals, of which one only can be used in a sealing system for light duty. If, in the middle of the design process the user changes the duty level from light to medium, the computer program product is caused to indicate that there is a mismatch in the design. The indication can be in the form of a sound signal, a coloring of the seal in question, or an automatic inclusion of a preferred seal that can cope with a duty at the medium level.

In another preferred embodiment of the computer program product, the computer program product is arranged for receiving information items from a plurality of databases. Depending on database size and location, it is in some cases advantageous to have a plurality of databases instead of a single one.

In another preferred embodiment of the computer program product, the databases are located at different geographical locations. Today it is technically convenient and easy to have interconnected servers arranged at different locations. This offers the advantage of easy updating of database information.

BRIEF DESCRIPTION OF THE DRAWINGS

The invention will now be further described with reference to the following drawings.

DETAILED DESCRIPTION OF PREFERRED EMBODIMENTS

Figure 1:
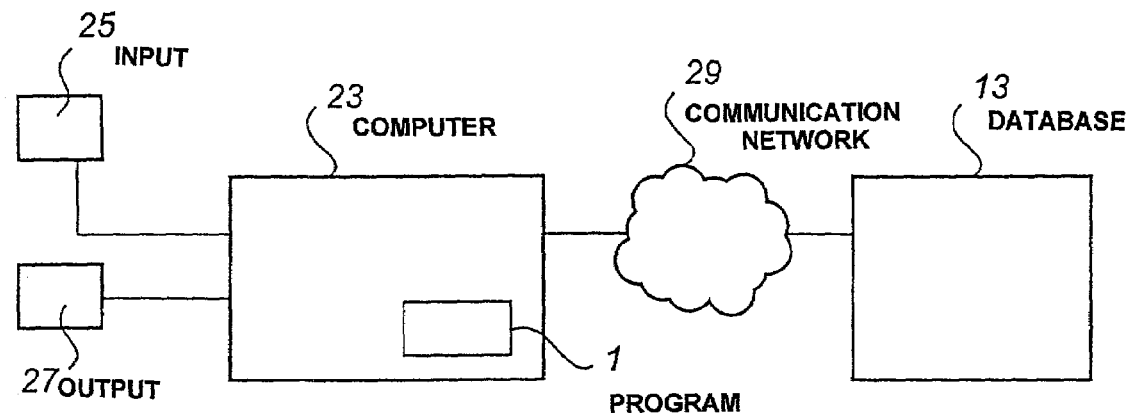
FIG. 1 schematically shows a computer program product for supporting a user designing a sealing system of a hydraulic cylinder.
Figure 2:
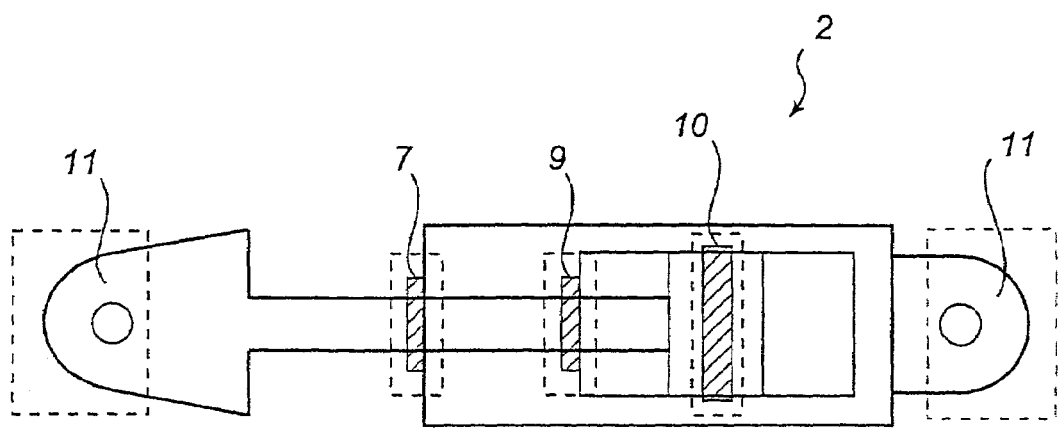
FIG. 2 schematically shows a sealing system of a hydraulic cylinder.

In FIG. 1, a computer program product 1 for supporting a user designing a sealing system of a hydraulic cylinder 2 is presented in its working environment. An example of a sealing system is schematically depicted as the combination of the dashed portions presented in FIG. 2. The support is accomplished by indicating at least one sealing system component information item 5, an example of which is schematically presented in FIG. 3. The sealing system component information item 5 comprises information concerning a sealing system component related to one of: seals 7, guide rings 9, piston seals 10 and rod end bearings 11 which is preferred for application in the hydraulic cylinder 2 based on the working conditions of the hydraulic cylinder 2. The computer program product 1 is arranged to obtain at least one sealing system component information item 5 from at least one database 13.

Figure 3:
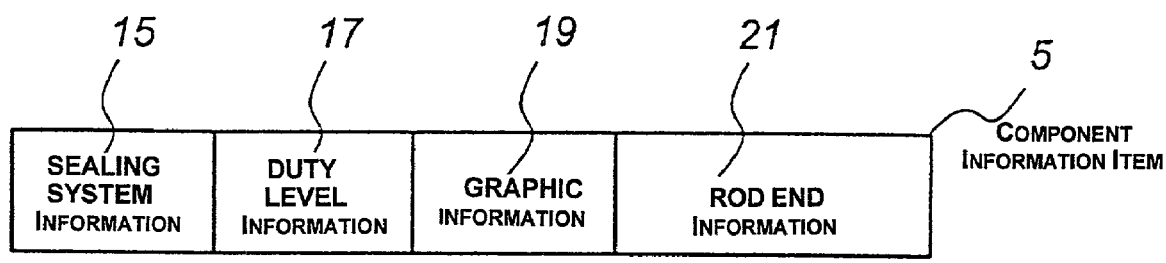
FIG. 3 schematically shows the structure of a sealing system component information item.

In FIG. 3 a structure of a sealing system component information item 5 is schematically illustrated. The sealing system component information item 5 is arranged to include:
a sealing system component text information item 15
duty level information item 17
sealing system component graphic information item 19
rod end information item 21.

All sealing system components that are available have a sealing system component information item 5 describing its features in the database 13.

The computer program product 1 is loadable into the internal memory of a computer 23 and comprising computer program code portions for performing the following steps when run on a computer 23 including input and output means 25, 27.

First an image of a hydraulic cylinder 2 using the output means 27 is presented. In this preferred embodiment the image is presented in FIG. 2.

Then the computer program product receives design criteria from the user in the form of duty level information 17 and rod end information 21 of the hydraulic cylinder 2 to be designed. The user uses the input means 25 to select one of a number of predetermined alternatives of duty level information and rod end information presented using the output means 27. In this preferred embodiment the 'Light' duty level information 17 option is chosen since the present design conforms to the following working environment criteria: "Pressure<16 MPa", "Velocity<0.5 m/s", and "Temperature: −30+80 degrees Centigrade". Thus the sealing system will be designed for light duty.

The rod end information item comprises at least one of 'operating condition', 'axial misalignment' and 'assembly variant'. In this embodiment, the operating conditions of the sealing system of the hydraulic cylinder 2 to be designed can be chosen among the following predetermined alternatives:
1) 'Sealing not necessary: −50-+300 degrees Centigrade'
2) 'Industry standard seal: −30-+130 degrees Centigrade'
3) 'Heavy Duty Seal: −20-+100 degrees Centigrade'.

The appropriate alternative above is selected. This concludes the information gathering of the working environment of the hydraulic cylinder 2.

Thereafter, the computer program product 1 receives an instruction from the user, using the input means 25, to present a selection of sealing system component information items 5 using the output means 27. The selection indicates at least one sealing system component information unit 5 that is considered to be preferred for application in the hydraulic cylinder 2. The selection is assembled by searching the sealing system component information unit 5 in the at least one database 13 in order to find sealing system component information items 5 fulfilling the design criteria, which are determined by the information inputted above.

Then the computer program product 2 is arranged to receive the user's sealing system component information item choice among the selection, which is pasted into the image of the hydraulic cylinder 2 at an appropriate place.

The user can, if so desired, test other selections by repeating the procedure above, or just repeating a single step of the procedure.

In case the user desires to make a change in the design. For instance the user changes the duty from 'Light' to 'Medium' the computer program product 1 is arranged to automatically to check whether the change leads to mismatch in the hydraulic cylinder design. This is accomplished by searching the sealing system component information units 5 in the at least one database 13 for mismatch in relation to the present design and the change. If a mismatch occurs, it is indicated for the user by coloring the mismatched component in a differing color.

After having designed the sealing system 3 of the hydraulic cylinder 2, it is possible to export a sealing system component information item 5, or a part thereof or the assembly of the sealing system component information items 5 used in the design, into the conventional computer aided design computer program product. More specifically, the computer program product 1 is arranged to accomplish the export of a sealing system component graphic information item 19 of a sealing system component information item 5 into a computer aided design drawing.

In this preferred embodiment of the computer program product 1 the at least one database 13 is arranged to be accessible via a communication network 29, such as the internet. In another embodiment the computer program product is arranged to access information from a plurality of databases. In another embodiment the computer program product 1 is arranged to comprise the at least one database 13.

In one preferred embodiment of the computer program product 1, the sealing system component text information item 15 includes at least one of: rod end bearing type, rod end bearing seal type, wiper seal type, guide ring type, rod seal type, and piston seal type.

In this preferred embodiment the input means is constituted by one of a keyboard and a mouse and the output means is constituted by a computer screen.

What is claimed is:

1. A computer-readable medium containing a computer program product for supporting a user in designing a sealing system of a hydraulic cylinder by indicating at least one sealing system component related seals, guide rings and rod end bearings for application in the hydraulic cylinder, based on the working conditions of the hydraulic cylinder;

the computer program product being arranged to obtain a plurality of sealing system component information items comprising information concerning sealing system components related to seals, guide rings and rod end bearings from at least one database; wherein the sealing system component information items include:
a sealing system component text information item;
a duty level information item;
a sealing system component graphic information item, and
a rod end information item, including required sealing intensity as a function of environment temperature,
the computer program product being loadable into the internal memory of a computer and comprising computer program code portions for performing the following steps when run on the computer which includes input means and output means:
a) presenting an imaging of a hydraulic cylinder using the output means;
b) receiving design criteria in the form of duty information and rod end information of the hydraulic cylinder to be designed by the user using the input means to select one of a number of predetermined alternatives of duty level information and rod end information presented using the output means;
c) receiving an instruction from the user, using the input means, to present a selection of sealing system component information items using the output means, the selection indicating sealing system component information items related to seals, guide rings and rod end bearings for application in the hydraulic cylinder, the selection being assembled by searching the sealing system component information units in the at least one database in order to find sealing system component information items fulfilling the design criteria;
d) receiving the user's sealing system component information item choice among the selection;
e) pasting the sealing system component graphic information item of the chosen sealing system information item into the image; and
f) repeating steps b), c), d) and e) at the user's request.

2. Computer readable medium according to claim 1 arranged as a program component in a conventional computer aided design computer program product.

3. Computer readable medium according to claim 2 arranged to export one or more sealing system component information items, or a part thereof, into the conventional computer aided design computer product.

4. Computer readable medium according to claim 3, being arranged to accomplish the export of a sealing system component graphic information item of a sealing system component information item into a computer aided design drawing.

5. Computer readable medium according to claim 1, also comprising the at least one database.

6. Computer readable medium according to claim 1, wherein the at least one database is arranged to be accessible via a communication network.

7. Computer readable medium according to claim 1, wherein the sealing system component text information item includes at least one of: rod end bearing type, rod end bearing seal type, wiper seal type, guide ring type, rod seal type, and piston seal type.

8. Computer readable medium according to claim 1, wherein the duty level information item is arranged to be one of 'Light', 'Medium', and 'Heavy'.

9. Computer readable medium according to claim 8, wherein the duty level information item is arranged to be a result from the duty levels information items combined with inputted data related to at least one of: pressure, velocity, and temperature.

10. Computer readable medium according to claim 1, wherein the component graphic information item is one of: a detailed drawing showing details of a component, and a schematic drawing depicting a component.

11. Computer readable medium according to claim 1, wherein the rod end information item comprises at least one of: an operating condition, an axial misalignment and an assembly variant.

12. Computer readable medium according to claim 1, wherein the input means comprises one of: a keyboard and a mouse.

13. Computer readable medium according to claim 1, wherein the output means comprises a computer screen.

14. Computer readable medium according to claim 1, wherein, in case the user changes at least one of the duty level information item and rod end information item during the design process, the computer program product is arranged:

to check whether the change leads to a mismatch in the hydraulic cylinder design by searching in the at least one database for a mismatch in relation to the present design and the change, and to indicate to the user if a mismatch has occurred.

15. Computer readable medium according to claim 1, wherein the sealing system component text information item includes at least one of: product name, groove design, dimensions, tolerances, and surface roughness of the sealing system components.

16. Computer readable medium according to claim 1, being arranged for receiving information items from a plurality of databases.

17. Computer readable medium according to claim 16, wherein the databases are located at different geographical locations.

18. Computer readable medium according to claim 1 comprising a CD-ROM.

* * * * *